(12) United States Patent
Hirao et al.

(10) Patent No.: US 9,312,461 B2
(45) Date of Patent: Apr. 12, 2016

(54) LIGHT-EMISSION ELEMENT ASSEMBLY AND METHOD OF MANUFACTURING SAME, AS WELL AS DISPLAY

(71) Applicant: Sony Corporation, Tokyo (JP)

(72) Inventors: Naoki Hirao, Kanagawa (JP); Hiroyuki Hosono, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/223,263

(22) Filed: Mar. 24, 2014

(65) Prior Publication Data

US 2014/0284634 A1    Sep. 25, 2014

(30) Foreign Application Priority Data

Mar. 25, 2013   (JP) .................. 2013-061433

(51) Int. Cl.
*H01L 33/48* (2010.01)
*H01L 33/62* (2010.01)
*H01L 33/54* (2010.01)
*H01L 23/00* (2006.01)

(52) U.S. Cl.
CPC ............... *H01L 33/62* (2013.01); *H01L 24/24* (2013.01); *H01L 33/486* (2013.01); *H01L 33/54* (2013.01); *H01L 2224/32245* (2013.01); *H01L 2224/73265* (2013.01); *H01L 2224/82001* (2013.01); *H01L 2924/12041* (2013.01); *H01L 2924/12042* (2013.01)

(58) Field of Classification Search
CPC ................. H01L 2924/00; H01L 2224/73265; H01L 2224/48247; H01L 2924/00014; H01L 2224/32245; H01L 33/48
USPC .................. 257/88, 79, 76, 98, 103
See application file for complete search history.

(56) References Cited

U.S. PATENT DOCUMENTS

2012/0187430 A1* 7/2012 West et al. ............... 257/88

FOREIGN PATENT DOCUMENTS

JP    2004-273596    9/2004

* cited by examiner

*Primary Examiner* — Chuong A Luu
*Assistant Examiner* — Rodolfo Fortich
(74) *Attorney, Agent, or Firm* — Hazuki International, LLC

(57) ABSTRACT

A light-emission element assembly includes: a light-emission element; a mold section in which the light-emission element is molded; a pad section protruding from an undersurface of the mold section, and electrically connected to the light-emission element; and a reinforcement section provided in the pad section, and projecting towards a side on which the mold section is provided.

14 Claims, 9 Drawing Sheets

OUTPUT OF LIGHT

LIGHT-EMISSION ELEMENT ASSEMBLY AND METHOD OF MANUFACTURING SAME, AS WELL AS DISPLAY

CROSS REFERENCE TO RELATED APPLICATIONS

This application claims the benefit of Japanese Priority Patent Application JP2013-61433 filed Mar. 25, 2013, and Japanese Priority Patent Application JP2014-45009 filed Mar. 7, 2014, the entire contents of which are incorporated herein by reference.

BACKGROUND

The present disclosure relates to a light-emission element assembly and a method of manufacturing the same, as well as a display.

In recent years, light-emission elements and displays in which a light-emission element that is a light emitting diode (LED) is used for a display pixel have been receiving attention, for a light-weight and thin image display. A light-emission element and a display has a characteristic of being free from viewing-angle dependence in which contrast and/or a hue vary depending on a viewing angle, and having a high rate of reaction in changing a color. However, it is desirable to mount and connect millions of light-emission elements on a mounted substrate, with a high yield. Therefore, a method of achieving a high yield with a simple process is expected.

For example, Japanese Unexamined Patent Application Publication No. 2004-273596 discloses a method of transferring light-emission elements collectively to a mounted substrate. Specifically, the light-emission elements are held by a resin layer on a transfer substrate, and the transfer substrate and the resin layer are detached at an interface therebetween, after the transfer substrate is bonded to the mounted substrate from the resin layer side, while holding the light-emission elements. The light-emission element may be thus assembled on the mounted substrate.

SUMMARY

Usually, a light-emission element is molded using a mold section, and a pad section protrudes from an undersurface of the mold section. The pad section has a thickness of about 1 μm, which is thin. Therefore, the pad section may be damaged when the light-emission element is assembled. In addition, when a defect is found in the light-emission element after the light-emission element is mounted on a mounted substrate, it is necessary to remove the light-emission element from the mounted substrate, to amount a defect-free new light-emission element on the mounted substrate. Therefore, the pad section may also be damaged, when this new light-emission element is assembled.

Hence, it is desirable to provide a light-emission element assembly having a configuration and a structure which prevent a pad section from being damaged. It is also desirable to provide a method of manufacturing such a light-emission element assembly, and a display including such a light-emission element assembly.

According to an embodiment (1) of the present disclosure, there is provided a light-emission element assembly including: a light-emission element; a mold section in which the light-emission element is molded; a pad section protruding from an undersurface of the mold section, and electrically connected to the light-emission element; and a reinforcement section provided in the pad section, and projecting towards a side on which the mold section is provided.

According to an embodiment (2) of the present disclosure, there is provided a light-emission element assembly including: a light-emission element; a mold section in which the light-emission element is molded; a pad section protruding from an undersurface of the mold section, and electrically connected to the light-emission element; and a reinforcement section configured of a mold-section extended section extended from the mold section, and provided on the pad section.

According to an embodiment (1) of the present disclosure, there is provided a display including a plurality of light-emission element assemblies arranged in a two-dimensional matrix, one or more of the plurality of light-emission element assemblies each including a light-emission element, a mold section in which the light-emission element is molded, a pad section protruding from an undersurface of the mold section, and electrically connected to the light-emission element, and a reinforcement section provided in the pad section, and projecting towards a side on which the mold section is provided.

According to an embodiment (2) of the present disclosure, there is provided a display including a plurality of light-emission element assemblies arranged in a two-dimensional matrix, one or more of the plurality of light-emission element assemblies each including a light-emission element, a mold section in which the light-emission element is molded, a pad section protruding from an undersurface of the mold section, and electrically connected to the light-emission element, and a reinforcement section configured of a mold-section extended section extended from the mold section, and provided on the pad section.

According to an embodiment (1) of the present disclosure, there is provided a method of manufacturing light-emission element assembly, the method including: preparing a light-emission element assembly, the light-emission element assembly including a light-emission element, a mold section in which the light-emission element is molded, and a pad section protruding from an undersurface of the mold section, and electrically connected to the light-emission element; and forming a reinforcement section, by forming a projection section in the pad section and then forming a metal layer on the pad section and the projection section, the reinforcement section being provided in the pad section, and being configured by the metal layer projecting towards a side on which the mold section is provided.

According to an embodiment (2) of the present disclosure, there is provided a method of manufacturing a light-emission element assembly, the method including: preparing a light-emission element assembly, the light-emission element assembly including a light-emission element, a mold section in which the light-emission element is molded, and a pad section protruding from an undersurface of the mold section, and electrically connected to the light-emission element; and forming, on the pad section, a reinforcement section configured of a mold-section extended section extended from the mold section.

According to the above-described embodiment (1) of the present disclosure, the reinforcement section is provided in the pad section and projects towards the side on which the mold section is provided. In addition, according to the above-described embodiment (2) of the present disclosure, the reinforcement section configured of the mold-section extended section extended from the mold section is provided on the pad section. Therefore, mechanical strength of the pad section is increased, and the pad section is prevented from being damaged when the light-emission element assembly is assembled.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present disclosure, and are incorporated in and constitute a part of this specification. The drawings illustrate embodiments and, together with the specification, serve to describe the principles of the technology.

DETAILED DESCRIPTION

Figure 1A:
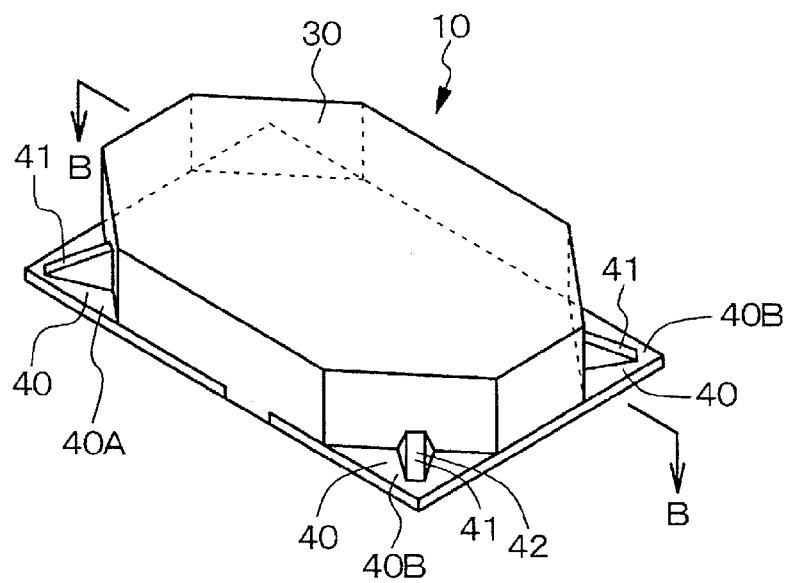
FIGS. 1A, 1B, and 1C are a perspective view of a light-emission element assembly of a first embodiment, a schematic cross-sectional diagram taken along an arrow B-B of FIG. 1A, and a schematic cross-sectional diagram of part of a reinforcement section and a mold section, respectively.

Some embodiments of the present disclosure will be described below with reference to the drawings. However, the present disclosure is not limited to the embodiments, and each of various kinds of numerical values and materials in the embodiments is provided as an example. It is to be noted that the description will be provided in the following order.
1. Overall description of a light-emission element assembly and a method of manufacturing the same according to the embodiment (1) or (2) of the present disclosure, and a display according to the embodiment (1) or (2) of the present disclosure 2. First embodiment (a light-emission element assembly and a method of manufacturing the same according to the embodiment (1) of the present disclosure)
3. Second embodiment (a display according to the embodiment (1) of the present disclosure)
4. Third embodiment (a light-emission element assembly and a method of manufacturing the same according to the embodiment (2) of the present disclosure, and a display according to the embodiment (2) of the present disclosure), and others

[Overall Description of a Light-Emission Element Assembly and a Method of Manufacturing the Same According to the Embodiment (1) or (2) of the Present Disclosure, and a Display According to the Embodiment (1) or (2) of the Present Disclosure]

In each of a light-emission element assembly according to the embodiment (1) of the present disclosure, and a light-emission element assembly provided in a display according to the embodiment (1) of the present disclosure, a reinforcement section may be configured using a metal layer. In addition, the metal layer may be provided to extend on a pad section.

Further, in a method of manufacturing a light-emission element assembly according to the embodiment (1) of the present disclosure, a metal layer may be obtained based on formation of a primary layer and formation of the metal layer on the primary layer based on a plating method. However, the way of forming the metal layer is not limited to these methods. For example, a lift-off method, or a combination of any of physical vapor deposition (PVD) and chemical vapor deposition (CVD) with an etching technique may be adopted. Furthermore, the metal layer may be provided to extend on a pad section.

In the light-emission element assembly according to the embodiment (1) of the present disclosure, the light-emission element assembly provided in the display according to the embodiment (1) of the present disclosure, and the light-emission element assembly obtained by the method of manufacturing the light-emission element assembly according to the embodiment (1) of the present disclosure each including the above-described preferable configurations, the reinforcement section may project (swell or rise) towards the mold section. In addition, in the light-emission element assembly according to the embodiment (1) or (2) of the present disclosure, the light-emission element assembly provided in the display according to the embodiment (1) or (2) of the present disclosure, and the light-emission element assembly obtained by the method of manufacturing the light-emission element assembly according to the embodiment (1) or (2) of the present disclosure each including the above-described preferable configurations, the pad section may protrude at least from four corners of the undersurface of the mold section. In this case, the reinforcement section may be formed at the pad section protruding from each of the four corners of the undersurface of the mold section.

In the light-emission element assembly according to the embodiment (1) or (2) of the present disclosure, the light-emission element assembly provided in the display according to the embodiment (1) or (2) of the present disclosure, and the light-emission element assembly obtained by the method of manufacturing the light-emission element assembly according to the embodiment (1) or (2) of the present disclosure each including the above-described preferable configurations (these light-emission element assemblies may be hereinafter collectively referred to as "the light-emission element assembly and the like according to some embodiments of the present disclosure"), the light-emission element may be configured using, for example, a layered structure. The layered structure may include a first compound semiconductor layer, an active layer configured using a compound semiconductor, and a second compound semiconductor layer. The first compound semiconductor layer may be electrically connected to a first electrode, and the second compound semiconductor layer may be electrically connected to a second electrode. The first electrode may be electrically connected to a first pad section included in the pad section, and the second electrode may be electrically connected to a second pad section included in the pad section. Examples of the light-emission element may include a light emitting diode (LED), a semiconductor laser device, and an electroluminescence (EL) device. The size (for example, chip size) of the light-emission element is not limited in particular, but the light-emission element is typically minute. Specifically, the light-emission element may have a size of, for the first embodiment mm or less, or, for example, 0.3 mm or less, or, for example, 0.1 mm or less. Examples of each of the light-emission element that emits red light, the light-emission element that emits green light, and the light-emission element that emits blue light may include a device using a nitride-based III-V compound semiconductor. Examples of the light-emission element that emits red light may also include a device using an AlGaInP-based compound semiconductor.

The mold section may be configured using an existing mold material (for example, a photosensitive polyimide resin) transparent for light emitted from the light-emission element. The method of molding the light-emission element may be an existing method.

The pad section, and the metal layer used to configure the reinforcement section each may be configured using a copper (Cu) layer. Examples of the shape of the reinforcement section projecting (swelling or rising) towards the mold section may include a rectangular shape (one side is connected to the pad section), a cone shape (including a shape in which the metal layer is removed from one side face), a truncated cone shape (including a shape in which the metal layer is removed from one side face), and a shape (including a shape in which the metal layer is removed from one side face) formed by cutting an inverted bowl along an imaginary non-horizontal plane. The examples of the shape of the reinforcement section may further include a shape (including a shape in which the metal layer is removed from one side face) in which each of two side faces facing each other is shaped like a triangle, and each of two side faces each connecting opposite sides of the respective triangles of the respective two side faces facing each other is shaped like a rectangle. In this shape, the number of sides is five, and the number of vertices is two. However, the shape of the reinforcement section is not limited to these examples.

The light-emission element assembly in which the reinforcement section is formed at the pad section (the light-emission element assembly according to the above-described embodiment (1) or (2) of the present disclosure) may be only a part of light-emission element assemblies included in a display. All the light-emission element assemblies each may not be necessarily configured using the light-emission element assembly in which the reinforcement section is formed at the pad section. However, it goes without saying that all the light-emission element assemblies each may be configured using the light-emission element assembly in which the reinforcement section is formed at the pad section. The number, types, mounting (arrangement), and/or the like of the light-emission element assemblies included in the display are determined, depending on applications and/or functions of the display, or depending on specifications and/or the like necessary for the display. If a display is configured using the light-emission element assembly that emits red light, the light-emission element assembly that emits green light, and the light-emission element assembly that emits blue light, a light-emission element and a display which perform color display may be obtained. Alternatively, the light-emission element that emits red light, the light-emission element that emits green light, and the light-emission element that emits blue light may be incorporated into a single light-emission element. It is to be noted that examples of the display may also include a backlight using the light-emission element assembly, and an illumination unit using the light-emission element assembly.

When the display is configured using the light-emission element and the display performing color display, one pixel in the light-emission element and the display is configured using a set (a light-emission unit) of a first light-emission element assembly, a second light-emission element assembly, and a third light-emission element assembly. In addition, a sub-pixel is configured using each of the light-emission element assemblies. Further, a plurality of light-emission units may be arranged in a first direction and a second direction orthogonal to the first direction, to be in a two-dimensional matrix. Assuming the number of the first light-emission element assemblies included in the light-emission unit is $N_1$, the number of the second light-emission element assemblies included in the light-emission unit is $N_2$, and the number of the third light-emission element assemblies included in the light-emission unit is $N_3$, each of $N_1$, $N_2$, and $N_3$ may be an integer of 1 or larger. Values of $N_1$, $N_2$, and $N_3$ may be equal, or may be different. When the value of each of $N_1$, $N_2$, and $N_3$ is an integer of 2 or larger, the light-emission element assemblies may be connected in series or may be connected in parallel, in a single light-emission unit. A combination of the values of $(N_1, N_2, N_3)$ is not limited, and may be exemplified by (1, 1, 1), (1, 2, 1), (2, 2, 2), and (2, 4, 2).

A projection section may be configured using, for example, any of materials including a resist material, an insulating material such as $SiO_2$ and SiN, a metallic material other than the material of the pad section and allowing easy formation. When the projection section is configured using the resist material, the projection section may be formed based on exposure, developing, and baking of the resist material, using a gray-scale mask or a halftone mask. Alternatively, the projection section may be formed by causing reflow of the resist material. When the projection section is configured using the insulating material, the projection section may be formed by performing etch back, after forming an etching mask from a resist material. In addition, examples of a method of forming the projection section may include liquid phase growth methods such as electroplating and electroless plating. The projection section may be eventually eliminated, or may be left. The primary layer may be configured using, for example, any of layers including: a combination of a copper layer (an upper layer) and a titanium layer (a lower layer); a combination of a gold layer (an upper layer) and a titanium layer (a lower layer); an aluminum layer (a primary layer of nickel electroless plating); and a palladium catalytic layer. Examples of a method of forming the primary layer may include physical vapor deposition (PVD) such as vacuum deposition and sputtering, chemical vapor deposition (CVD), coating, and spraying. The plating method of forming the metal layer may be, specifically, electroplating. Alternatively, electroless plating including a so-called semi-additive method may be adopted as the plating method of forming the metal layer. If the reinforcement section is made hollow, and a hollow part of the reinforcement section is filled with a mold material, mechanical strength of the pad section is allowed to be further improved.

First Embodiment

Figure 1B:
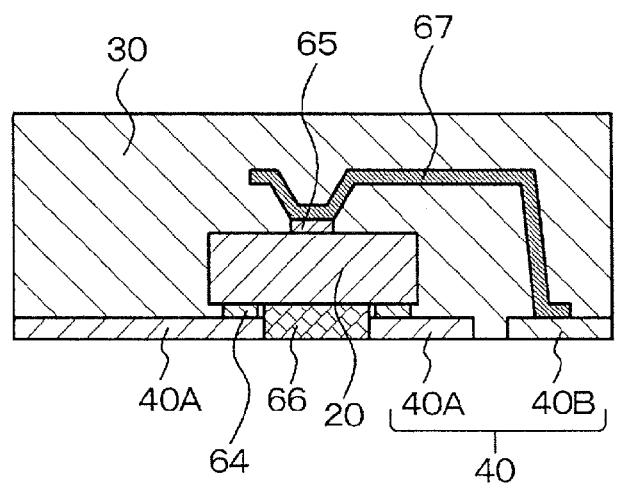
Figure 1C:
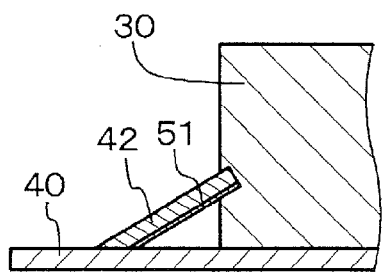
Figure 2A:
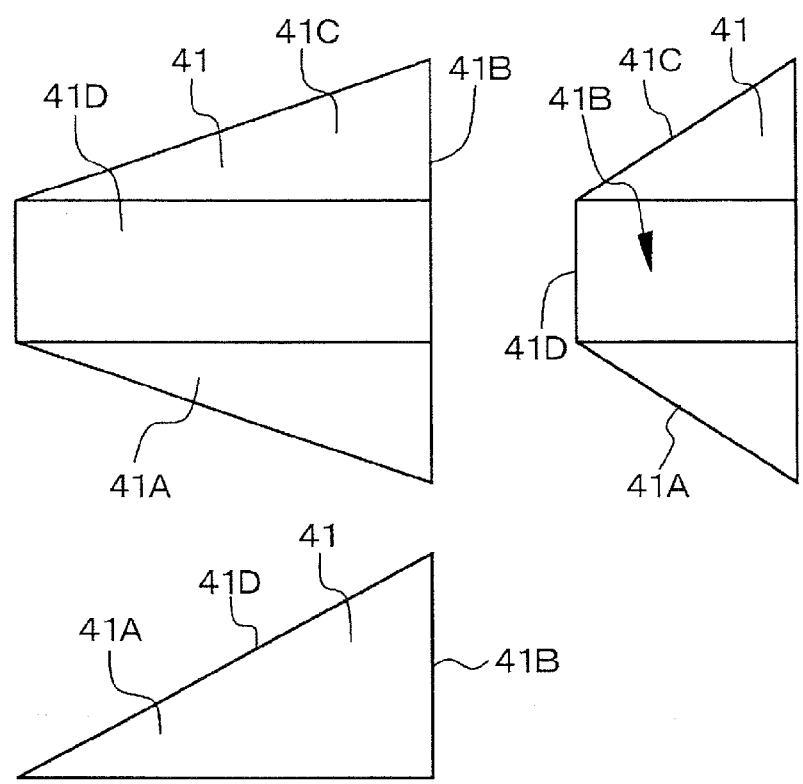
FIGS. 2A and 2B are a diagram and a schematic perspective view, respectively, of the reinforcement section included in the light-emission element assembly of the first embodiment. The diagram of FIG. 2A includes a plan view, a front view, a right-side view of the reinforcement section.
Figure 2B:
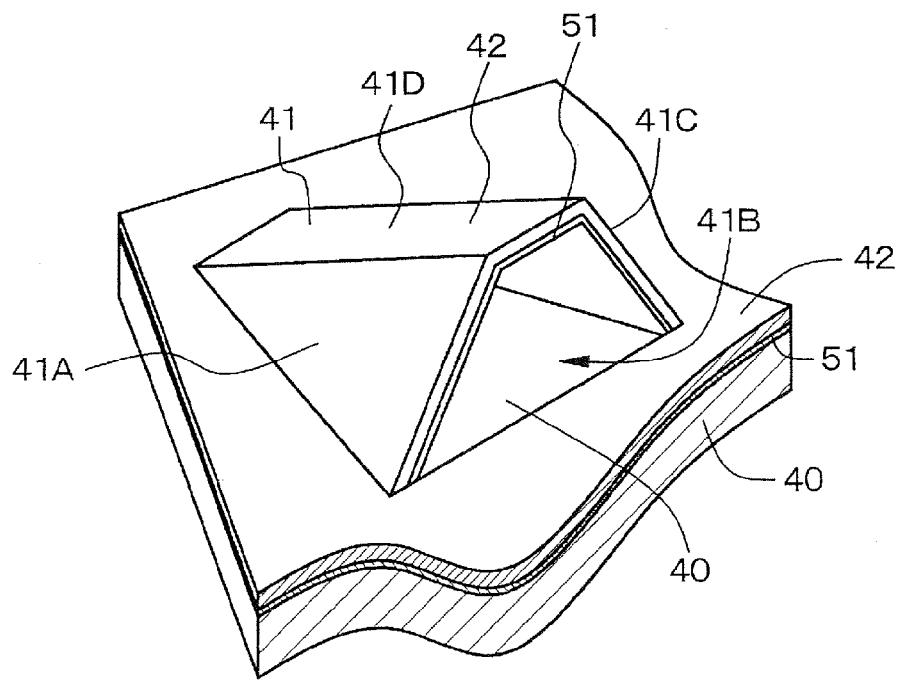

The first embodiment relates to a light-emission element assembly and a method of manufacturing the light-emission element assembly according to the embodiment (1) of the present disclosure. FIG. 1A illustrates a perspective view of the light-emission element assembly of the first embodiment, FIG. 1B illustrates a schematic cross-sectional diagram taken along an arrow B-B of FIG. 1A, and FIG. 1C illustrates a schematic cross-sectional diagram of part of a reinforcement section and a mold section. Further, FIG. 2A illustrates a plan view, a front view, and a right-side view of the reinforcement section, and FIG. 2B illustrates a schematic perspective view of the reinforcement section. It is to be noted that a mounted substrate is arranged under the light-emission element assembly, but illustration of this mounted substrate is omitted in FIG. 1A.

A light-emission element assembly 10 of the first embodiment includes a light-emission element 20, a mold section 30 in which the light-emission element 20 is molded, and a pad section 40 (a first pad section 40A and a second pad section 40B) protruding from an undersurface of the mold section 30, and electrically connected to the light-emission element 20. Further, a reinforcement section 41 is formed at the pad section 40. Specifically, at the pad section 40, the reinforcement section 41 projecting (swelling or rising) towards the mold section side is formed. In other words, the reinforcement section 41 having a three-dimensional structure is formed at the pad section 40. The light-emission element 20 is, specifically, a light emitting diode (LED).

Here, the reinforcement section 41 is configured using a metal layer 42, specifically, a copper (Cu) layer. The pad section 40 is configured using a copper (Cu) layer as well. The metal layer 42 is provided to extend on the pad section 40. Further, the reinforcement section 41 projects towards the mold section 30 made from a photosensitive polyimide resin. The pad section 40 protrudes at least from each of four corners of the undersurface of the mold section 30. A tip of the reinforcement section 41 is embedded in the mold section 30 (see FIG. 1C). It is to be noted that the reinforcement section 41 is formed at each of four places in total, i.e., at the pad section 40 protruding from each of the four corners of the undersurface of the mold section 30. However, FIG. 1A illustrates only the reinforcement section 41 at each of the three places, and illustration of the reinforcement section 41 at the hidden invisible place is omitted.

In the reinforcement section 41, specifically, each of two side faces 41A and 41C facing each other is shaped like a triangle, and each of two side faces 41B and 41D each connecting opposite sides of the respective triangles of the respective two side faces 41A and 41C facing each other is shaped like a rectangle (the side face 41B is shaped like a trapezoid, and the side face 41D is shaped like an oblong). The number of sides is five, and the number of vertices is two. It is to be noted that the metal layer 42 is removed from the one side face 41B of the rectangle (specifically, the trapezoid), and the reinforcement section 41 is substantially hollow.

The method of manufacturing the light-emission element assembly (specifically, a reinforcement-section forming process) of the first embodiment will be described below with reference to FIGS. 3A and 3B that are schematic perspective views of elements including a projection section.

[Process 100]

A light-emission element chip that includes the light-emission element 20 and the pad section 40 electrically connected to the light-emission element 20 is manufactured beforehand. It is to be noted that a specific method of manufacturing such a light-emission element chip will be described in the second embodiment.

[Process 110]

Figure 3A:
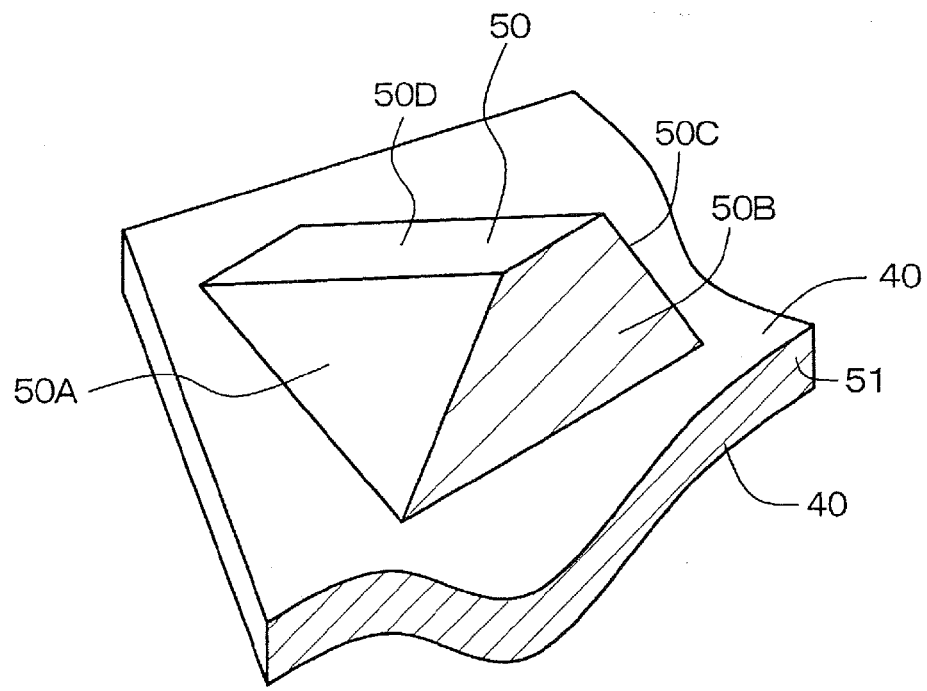
FIGS. 3A and 3B are schematic partial cross-sectional diagrams each illustrating elements including a projection section, and used to describe a method of manufacturing (a reinforcement-section forming process) of the light-emission element assembly of the first embodiment.
Figure 3B:
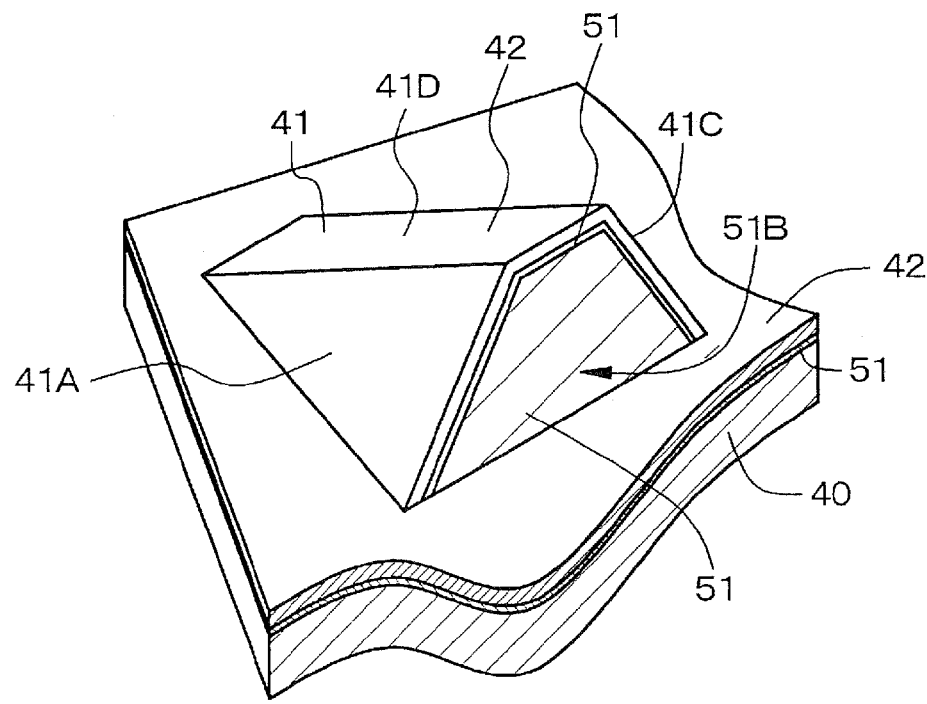

A projection section (a base used to form the reinforcement section 41) 50 is formed on the pad section 40 (see FIG. 3A). It is to be noted that the pad section 40 is a copper layer having a thickness of 1.0 μm. Specifically, on the pad section 40, the projection section 50 made from a resist material is formed based on exposure, developing, and baking of the resist material. It is to be noted that used as a mask for exposure is, but not limited to, a gray-scale mask. The projection section 50 has such an external shape that each of two side faces 50A and 50C facing each other is shaped like a triangle, and each of two side faces 50B and 50D connecting opposite sides of the respective triangles of the respective two side faces 50A and 50C facing each other is shaped like a rectangle (the side face 50B is shaped like a trapezoid, and the side face 50D is shaped like an oblong). The number of sides is five, and the number of vertices is two. It is to be noted that side face 50B of the projection section 50 is diagonally shaded for convenience.

[Process 120]

Subsequently, the metal layer 42 is formed on the pad section 40 and the projection section 50. Here, the metal layer 42 is formed by forming a primary layer 51, and forming the metal layer 42 on the primary layer 51 based on a plating method (specifically, electroplating). In other words, the formation of the metal layer 42 is performed based on a semi-additive method. Specifically, the primary layer 51 is obtained by sequentially forming a titanium (Ti) layer having a thickness of 50 nm and a copper (Cu) layer having a thickness of 200 nm on the entire surface, based on sputtering. Next, a resist mask covering a region where the metal layer 42 is not to be formed is formed, and the metal layer 42 that is a copper layer having a thickness of 2 μm is formed on a part of the primary layer 51 based on the electroplating, the part being not covered with the resist mask (see FIG. 3B). It is to be noted that the side face 50B of the projection section 50 is covered with the resist mask, and the metal layer 42 is not formed on the side face 50B of the projection section 50. The resist mask is then removed, and further, the primary layer 51 is removed by soft etching, which is followed by removal of the projection section 50. Subsequently, the light-emission element 20 is molded using a mold material, so that the mold section 30 in which the light-emission element 20 is molded is allowed to be obtained. Thus, it is possible to obtain a structure illustrated in each of FIGS. 1A, 1B, and 1C, namely, a structure in which the reinforcement section 41 projecting towards the mold section 30 side is formed at the pad section 40 (the first pad section 40A and the second pad section 40B).

As described above, in the light-emission element assembly of the first embodiment, the reinforcement section having the three-dimensional structure projecting towards the mold section side is formed at the pad section. Therefore, the pad section is prevented from being damaged when the light-emission element assembly is assembled in a later process. In addition, the size of the entire light-emission element assembly is allowed to be reduced. Moreover, formation of the reinforcement section also depends on a process of manufacturing the light-emission element assembly, but an additional process may be unnecessary.

Figure 4:
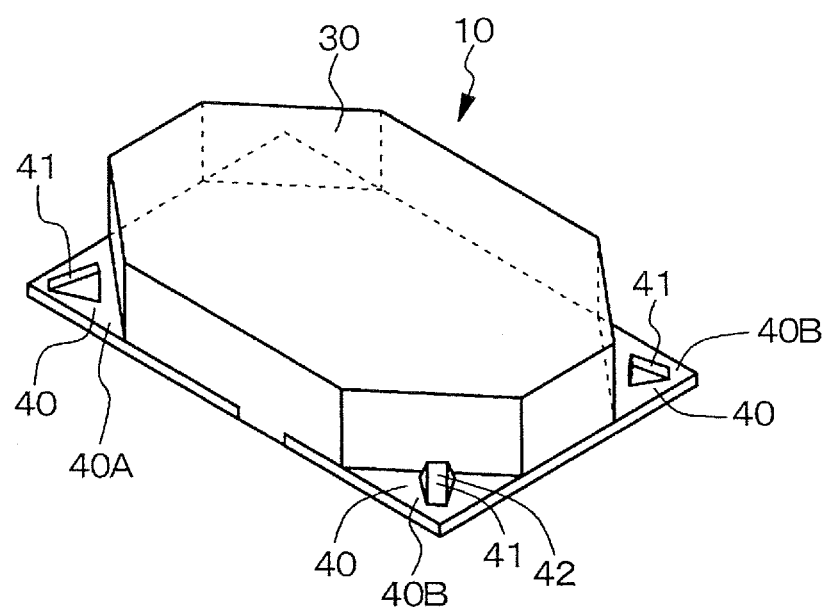
FIG. 4 is a perspective view of a modification of the light-emission element assembly of the first embodiment.
Figure 5A:
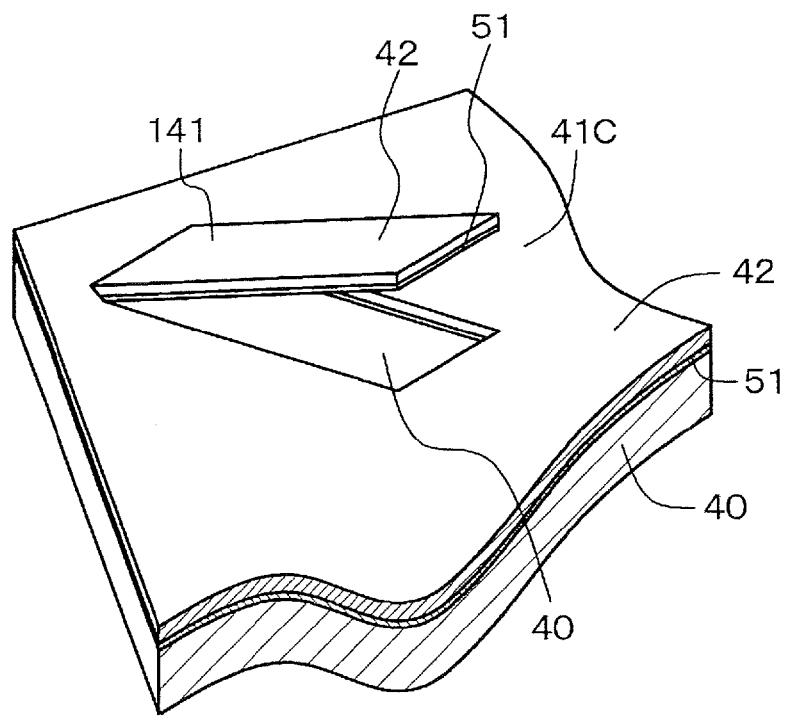
FIGS. 5A and 5B are perspective views of a modification of the reinforcement section.
Figure 5B:
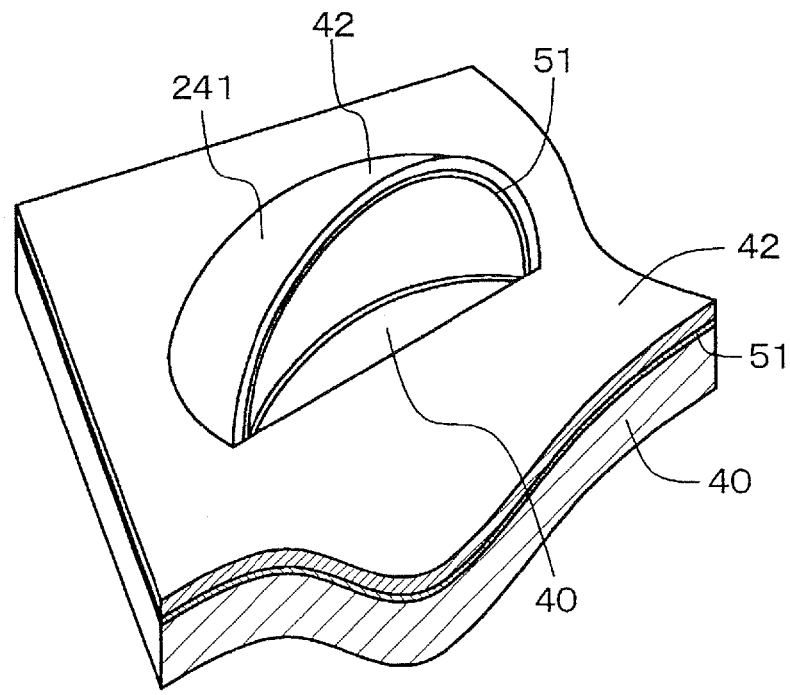

The reinforcement section 41 may be provided apart from the mold section 30, as illustrated in FIG. 4 that is a perspective view illustrating a modification of the light-emission element assembly of the first embodiment. In addition, a structure, in which a part below the reinforcement section 41 projecting towards the mold section 30 is filled with a mold material, may be adopted. Alternatively, a reinforcement section 141 projecting towards the mold section 30 and shaped like a rectangle (one side is connected to the pad section 40) may be provided, as illustrated in a schematic perspective view of FIG. 5A. It is to be noted that, in such a configuration, a structure in which a tip of the reinforcement section 141 is in contact with the mold section 30 or embedded in the mold section 30 may be preferably adopted. Alternatively, a structure in which a part below the reinforcement section 141 projecting towards the mold section 30 is filled with a mold material may be preferably adopted. Still alternatively, as illustrated in a schematic perspective view of FIG. 5B, a reinforcement section 241 projecting towards the mold section 30 and having a shape formed by cutting an inverted bowl along an imaginary non-horizontal plane (specifically, a vertical plane) may be provided (in this example illustrated in FIG. 5B, the metal layer is removed from a cut section). Alternatively, a cone shape (including a shape in which the metal layer is removed from one side face), or a truncated cone shape (including a shape in which the metal layer is removed from one side face) may be adopted.

Second Embodiment

The second embodiment relates to a display according to the embodiment (1) of the present disclosure, and specifically relates to a light-emission element and a display in which a light-emission element that is a light emitting diode (LED) is used for a display pixel. The display of the second embodiment is provided with a plurality of light-emission element assemblies arranged in a two-dimensional matrix. Each of the light-emission element assemblies includes the light-emission element 20, the mold section 30 in which the light-emission element 20 is molded, and the pad section 40 protruding from the undersurface of the mold section 30 and electrically connected to the light-emission element 20. Further, at the pad section 40 included in one or more of the plurality of light-emission element assemblies, the reinforcement section 41 is formed. Specifically, at the pad section 40 included in one or more of the plurality of light-emission element assemblies, the reinforcement section 41 projecting (swelling or rising) towards the mold section side is formed. In other words, one or more of the plurality of light-emission element assemblies are configured using the light-emission element assembly 10 described in the first embodiment.

The light-emission element assembly configured using the light-emission element assembly 10 described in the first embodiment or using the light-emission element assembly 10 described in a third embodiment described later may be a part of the light-emission element assemblies included in the display. All the light-emission element assemblies each may not be necessarily configured using the light-emission element assembly 10 described in the first embodiment or using the light-emission element assembly 10 described in the third embodiment described later. However, it goes without saying that all the light-emission element assemblies each may be configured using the light-emission element assembly 10 described in the first embodiment or using the light-emission element assembly 10 described in the third embodiment described later. In particular, when a defect is found in a light-emission element assembly (specifically, in a light-emission element) after the light-emission element assembly is mounted on a mounted substrate, it may be necessary to remove the light-emission element assembly from the mounted substrate and then to mount a defect-free new light-emission element assembly. This light-emission element assembly to be newly mounted may be preferably configured using the light-emission element assembly 10 described in the first embodiment or using the light-emission element assembly 10 described in the third embodiment described later.

A method of assembling the display of the second embodiment will be described below with reference to FIGS. 6A, 6B, 6C, 6D, 7A, 7B, 8A, 8B, and 8C. These figures are schematic partial cross-sectional diagrams similar to the diagram taken along the arrow B-B of FIG. 1A.

[Process 200]

Figure 6A:
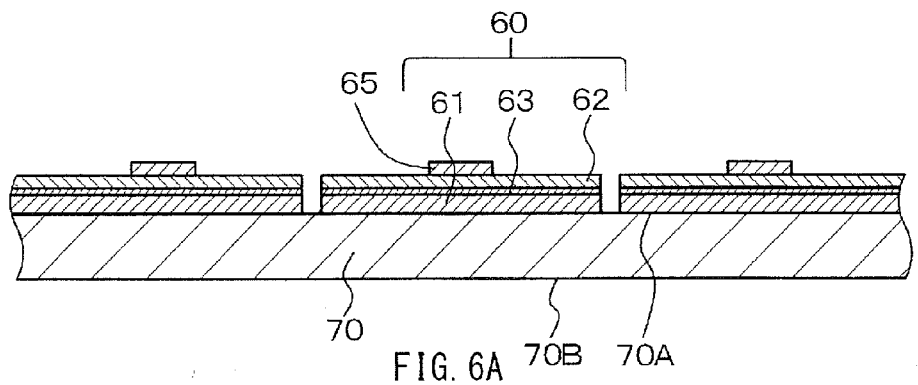
FIGS. 6A to 6D are schematic partial cross-sectional diagrams illustrating elements including a light-emission element, and used to describe a method of manufacturing a light-emission element assembly of a second embodiment.
Figure 6B:
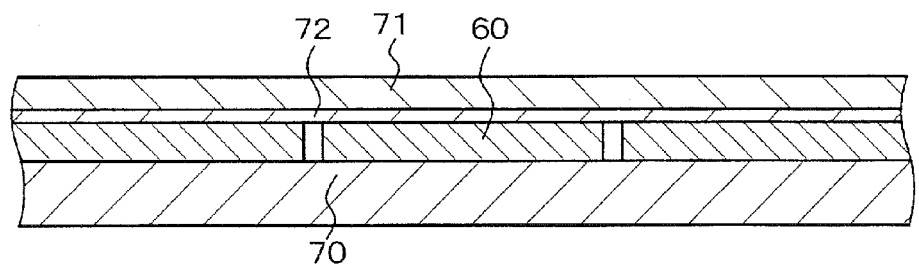
Figure 6C:
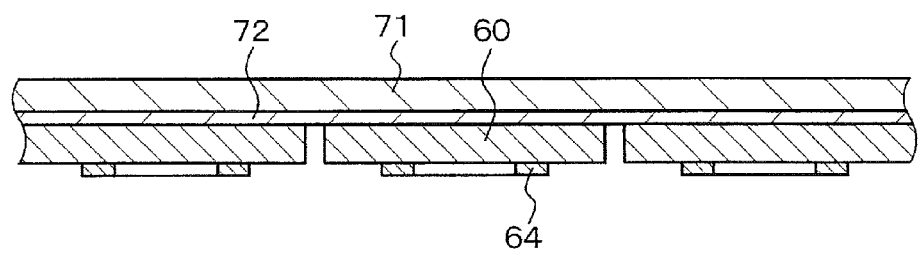
Figure 6D:
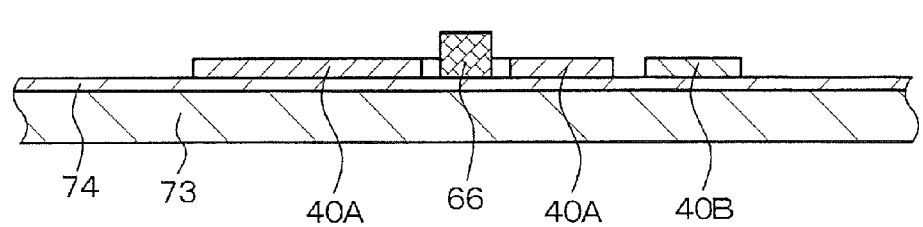

First, based on an existing method, for example, an MOCVD method, a layered structure 60 may be formed on a first surface 70A of a light-emission element manufacturing substrate 70. The layered structure 60 includes a first compound semiconductor layer 61, an active layer 63 made from a compound semiconductor, and a second compound semiconductor layer 62. Further, a second electrode 65 is formed on the layered structure 60. It is to be noted that a composition, a configuration, and a structure of each of the first compound semiconductor layer 61, the active layer 63, and the second compound semiconductor layer 62 included in the laminated structure 60, as well as the second electrode 65 may be determined based on specifications necessary for the light-emission element. Next, the second electrode 65 and the laminated structure 60 may be, for example, etched or milled for device isolation. The layered structure 60 on which the second electrode is formed and the device isolation is performed, as illustrated in FIG. 6A, may be obtained in this way. It is to be noted that in the subsequent drawings, illustration of the second electrode 65 may be omitted.

[Process 210]

A supporting substrate 71 having an uncured adhesive layer 72 formed on an entire surface thereof is prepared. Subsequently, the uncured adhesive layer 72 and the second compound semiconductor layer 62 of the laminated structure 60 are brought into contact with each other to cure the adhesive layer 72, so that the layered structure 60 adheres to the supporting substrate 71 (see FIG. 6B). The light-emission element manufacturing substrate 70 is then thinned by a lapping method or a CMP method, from a back surface 70B. When the lapping method is adopted, further, the light-emission element manufacturing substrate 70 is removed by etching with a mixed solution of ammonia water and a hydrogen peroxide solution. Next, a first electrode 64 is formed on the first compound semiconductor layer 61 by a lift-off method and vacuum deposition. A structure illustrated in FIG. 6C may be obtained in this way. It is to be noted that the device isolation may be performed in Process 210 without being performed in Process 200.

[Process 220]

Figure 7A:
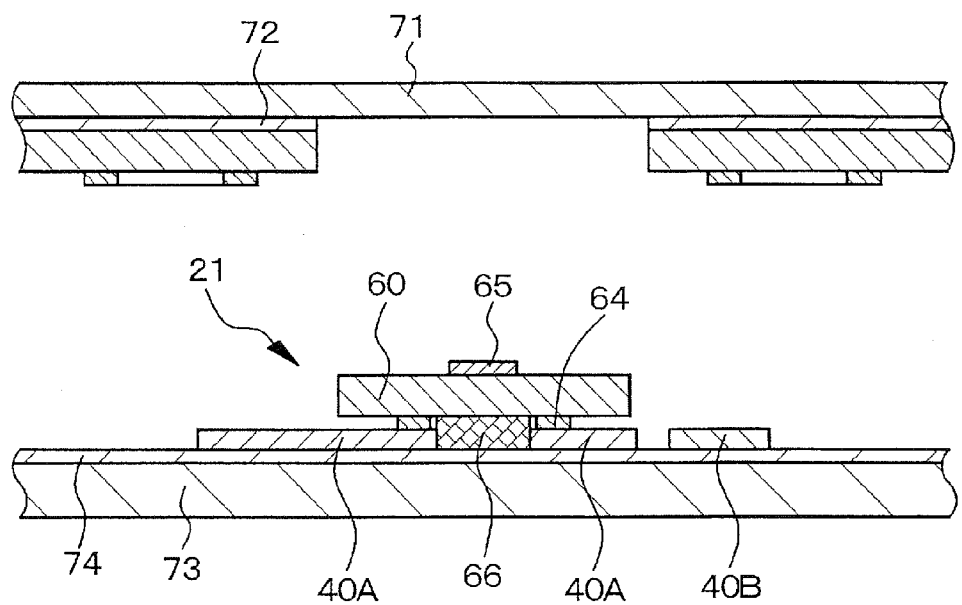
FIGS. 7A and 7B are schematic partial cross-sectional diagrams illustrating elements including the light-emission element, and used to describe the method of manufacturing the light-emission element assembly of the second embodiment, following FIG. 6D.

A pad-section formed substrate 73 is prepared. On the pad-section formed substrate 73, an uncured adhesive 66 is formed on a part where the laminated structure 60 is to be fixed, and the pad section 40 (the first pad section 40A and the second pad section 40B) is formed (see FIG. 6D). It is to be noted that the pad section 40 is formed on a release layer 74 formed on a surface of the pad-section formed substrate 73. The uncured adhesive 66 and the laminated structure 60 (specifically, the first compound semiconductor layer 61) are then brought into contact with each other, and laser abrasion may be caused by, for example, irradiating the adhesive layer 72 with an excimer laser, to remove the layered structure 60 from the supporting substrate 71. The adhesive 66 is then cured. A structure (a light-emission element chip 21) in which the laminated structure 60 is fixed onto the pad-section formed substrate 73 by the adhesive 66, as illustrated in FIG. 7A, may be obtained in this way. Subsequently, the first pad section 40A and the first electrode 64 are electrically connected to each other by a plating method.

[Process 230]

Figure 7B:
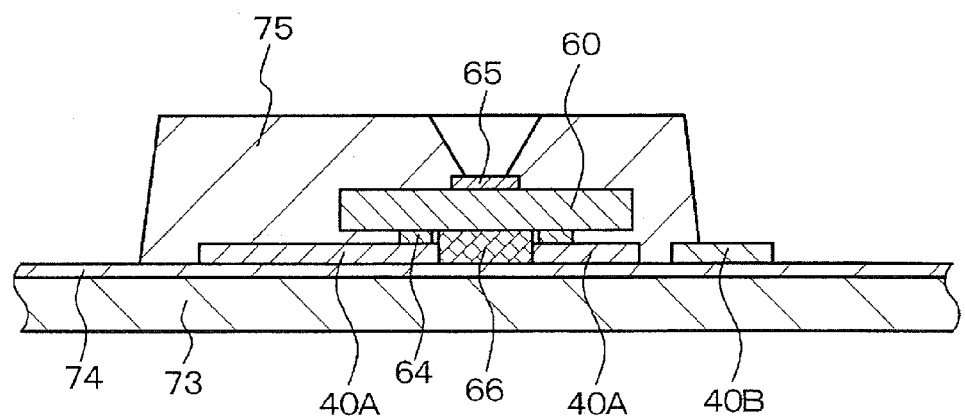

Next, a sacrificial layer 75 is formed to cover a region from the laminated structure 60 to a part of the second pad section 40B (see FIG. 7B). The sacrificial layer 75 is not formed on a part of the second compound semiconductor layer 62 of the laminated structure 60. At the same time, the projection section 50 described in the first embodiment is formed on the first pad section 40A and the second pad section 40B (see [Process 110] of the first embodiment). An additional process is unnecessary for the formation of the projection section 50, and only the pattern of the mask used to form the sacrificial layer 75 may be modified.

[Process 240]

Figure 8A:
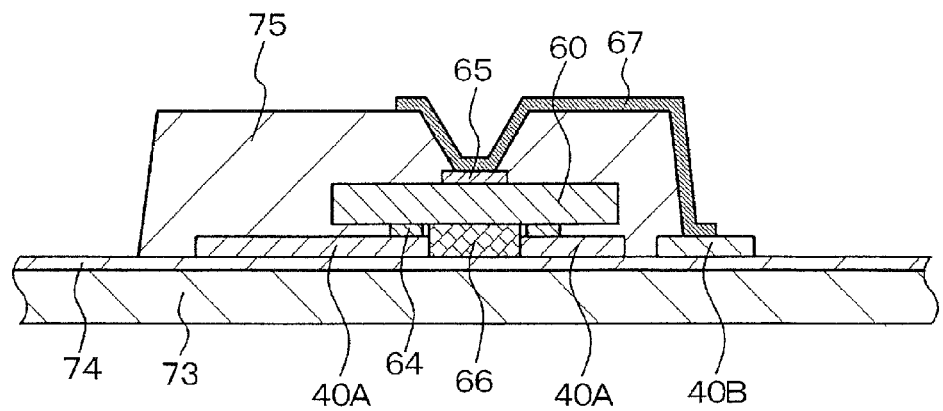
FIGS. 8A to 8C are schematic partial cross-sectional diagrams illustrating elements including the light-emission element, and used to describe the method of manufacturing the light-emission element assembly of the second embodiment, following FIG. 7B.
Figure 8B:
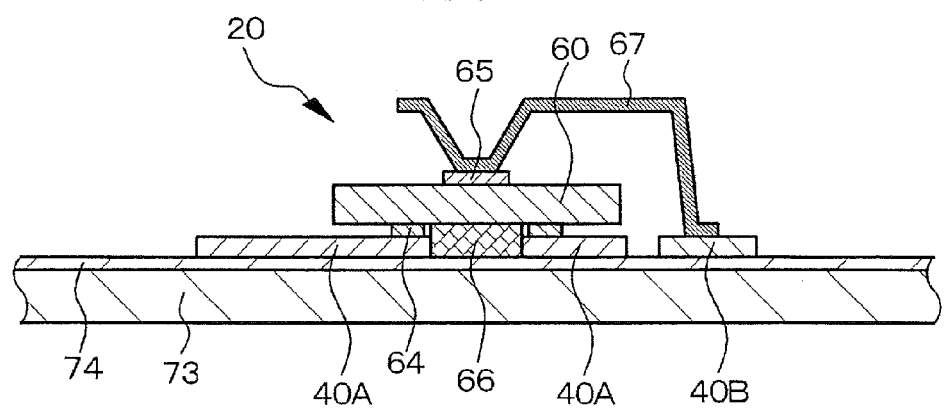

Next, a wiring layer 67 is formed to cover a region from the second electrode 65 to the sacrificial layer 75 and the second pad section 40B (see FIG. 8A). A structure in which the second electrode 65 and the second pad section 40B are connected with the wiring layer 67 may be obtained in this way. Simultaneously with the formation of the wiring layer 67, the reinforcement section 41 is formed at the pad section 40 as described in the first embodiment. The wiring layer 67 may be formed by the same method as that of the reinforcement section 41 simultaneously. In other words, an additional process is unnecessary for the formation of the reinforcement section 41. The sacrificial layer 75 is then removed in a manner similar to that in the first embodiment, making it possible to obtain a structure illustrated in FIG. 8B. It is to be noted that when the sacrificial layer 75 is removed, the projection section 50 is also removed (for the process described here, see [Process 120] of the first embodiment).

[Process 250]

Figure 8C:
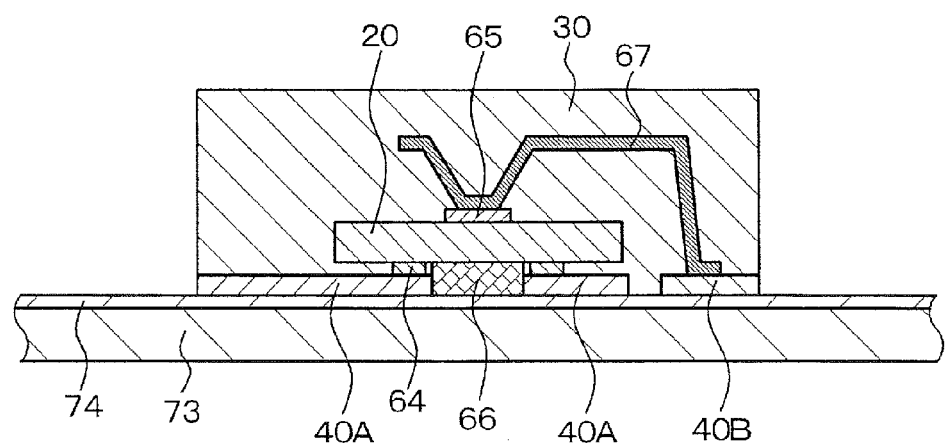

Subsequently, the light-emission element 20 is molded using a mold material, so that the mold section 30 in which the light-emission element 20 is molded is allowed to be obtained (see FIG. 8C). A structure in which the first pad section 40A and the second pad section 40B protrude from the mold section 30 may be obtained in this way.

[Process 260]

A relay substrate having a bonding layer formed on an entire surface thereof is prepared. The bonding layer and the mold section 30 are then brought into contact with each other, to allow the mold section 30 to adhere to the bonding layer. Subsequently, laser abrasion is caused by irradiating the release layer 74 with an excimer laser to remove the pad-section formed substrate 73 from the light-emission element assembly 10. Afterwards, the pad section 40 of the light-emission element assembly 10 on the relay substrate is electrically connected to wiring provided at the mounted substrate, and the relay substrate is removed by an existing method. The display may be obtained in this way.

To be more specific, from the pad-section formed substrate where the multiple first light-emission element assemblies that emit red light are arranged, the first light-emission element assembly is transferred to a predetermined position of the relay substrate. Further, from the pad-section formed substrate where the multiple second light-emission element assemblies that emit green light are arranged, the second light-emission element assembly is transferred to a predetermined position of the relay substrate. Furthermore, from the pad-section formed substrate where the multiple third light-emission element assemblies that emit blue light are arranged, the third light-emission element assembly is transferred to a predetermined position of the relay substrate. In this way, it is possible to arrange a set (a light-emission unit) of the first light-emission element assembly, the second light-emission element assembly, and the third light-emission element assembly, at a desirable position of the relay substrate. Subsequently, the pad section 40 of each of the light-emission element assemblies 10 included in the light-emission unit on the relay substrate is electrically connected to the wiring provided at the mounted substrate, and the relay substrate is removed by the existing method. The display may be obtained in this way. It is to be noted that one pixel is configured using the set (the light-emission unit) of the first light-emission element assembly, the second light-emission element assembly, and the third light-emission element assembly. In addition, a sub-pixel is configured using each of the light-emission element assemblies. Moreover, a plurality of light-emission units are arranged in a first direction and a second direction orthogonal to the first direction, to be in a two-dimensional matrix. The same applies to the third embodiment described later.

It is to be noted that, one pixel may include one light-emission element assembly, and the one light-emission element assembly may incorporate the light-emission element that emits red light, the light-emission element that emits green light, and the light-emission element that emits blue light. The same applies to the third embodiment described later.

Third Embodiment

Figure 9A:
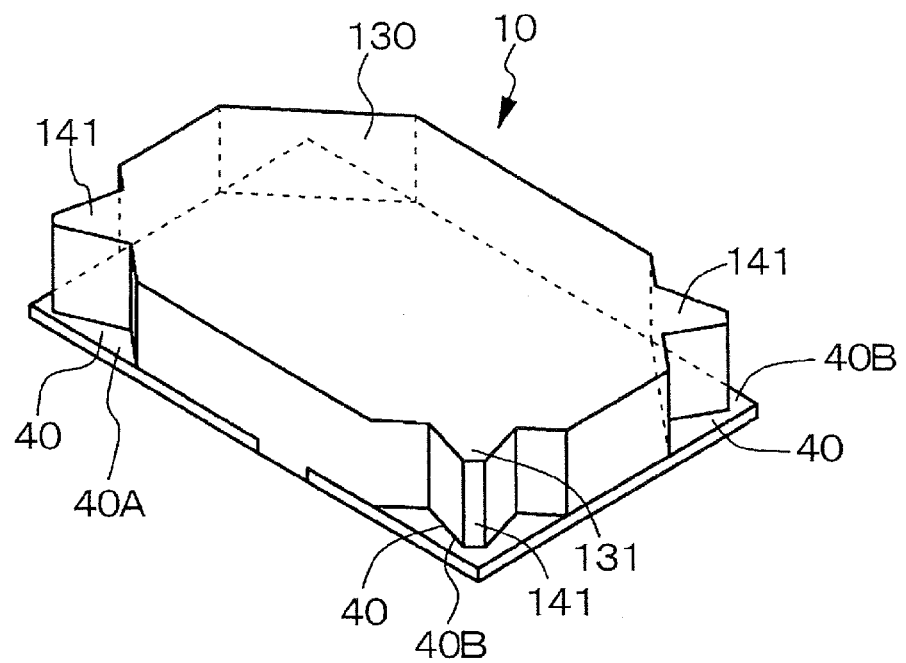
FIGS. 9A and 9B are a perspective view of a light-emission element assembly of a third embodiment, a schematic cross-sectional diagram of part of a reinforcement section and a mold section, respectively.
Figure 9B:
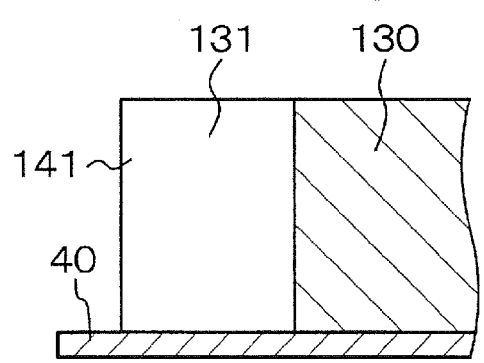

The third embodiment relates to a light-emission element assembly and a method of manufacturing the light-emission element assembly according to the embodiment (2) of the present disclosure as well as to a display according to the embodiment (2) of the present disclosure, more specifically, to a light-emission element and a display in which a light-emission element that is a light emitting diode (LED) is used for a display pixel. FIG. 9A illustrates a perspective view of the light-emission element assembly of the third embodiment, and FIG. 9B illustrates a schematic cross-sectional diagram of part of the reinforcement section and the mold section. It is to be noted that a mounted substrate is arranged under the light-emission element assembly, but illustration of this mounted substrate is omitted in FIG. 9A.

The light-emission element assembly 10 of the third embodiment includes the light-emission element 20, a mold section 130 in which the light-emission element 20 is molded, and the pad section 40 (the first pad section 40A and the second pad section 40B) protruding from an undersurface of the mold section 130, and electrically connected to the light-emission element 20. Further, a reinforcement section 141 is formed on the pad section 40. Specifically, on the pad section 40, the reinforcement section 141 that is configured of a mold-section extended section 131 extended from the mold section 130 is formed. The light-emission element 20 is, specifically, a light emitting diode (LED), as with the first embodiment.

Here, the pad section 40 is configured using a copper (Cu) layer as with the first embodiment, and the mold section 130 and the mold-section extended section 131 are configured of a sensitive polyimide resin. The pad section 40 protrudes at least from each of four corners of the undersurface of the mold section 130. The reinforcement section 141 is formed at each of four places in total, i.e., at the pad section 40 protruding from each of the four corners of the undersurface of the mold section 130. However, FIG. 9A illustrates only the reinforcement section 141 at each of the three places, and illustration of the reinforcement section 141 at the hidden invisible place is omitted.

As described above, in the light-emission element assembly of the third embodiment, the reinforcement section 141 configured of the mold-section extended section 131 extended from the mold section 130 is formed on the pad section 40 (in contact with the pad section 40). Therefore, the pad section is prevented from being damaged when the light-emission element assembly is assembled in a later process. In addition, the size of the entire light-emission element assembly is allowed to be reduced. Moreover, formation of the reinforcement section also depends on a process of manufacturing the light-emission element assembly, but an additional process may be unnecessary.

The display of the third embodiment is provided with a plurality of light-emission element assemblies arranged in a two-dimensional matrix. Each of the light-emission element assemblies includes the light-emission element 20, the mold section 130 in which the light-emission element 20 is molded, and the pad section 40 protruding from the undersurface of the mold section 130 and electrically connected to the light-emission element 20. Further, on the pad section 40 included in one or more of the plurality of light-emission element assemblies, the reinforcement section 141 that is configured of the mold-section extended section 131 extended from the mold section 130 is formed.

A method of assembling the display of the third embodiment will be described below

[Process 300]

First, the processes similar to [Process 200] to [Process 240] of the second embodiment are performed. However, in the process similar to [Process 240], it is unnecessary to form the reinforcement section 41 of the pad section 40, but the reinforcement section 41 may be formed at the pad section 40.

[Process 310]

Subsequently, the light-emission element 20 is molded using a mold material, so that the mold section 130 in which the light-emission element 20 is molded is allowed to be obtained. It is to be noted that, at this time, the reinforcement section 141 that is configured of the mold-section extended section 131 extended from the mold section 130 is formed on the pad section 40 at the same time. Accordingly, a structure in which the reinforcement section 141 that is configured of the mold-section extended section 131 extended from the mold section 130 is formed in contact with the pad section 40 on the pad section 40 may be obtained.

[Process 320]

After that, the process similar to [Process 260] of the second embodiment is performed to obtain the display.

The present disclosure has been described above with reference to the preferable embodiments, but is not limited thereto. The configurations and the structures of the light-emission element assembly described in the embodiments, as well as the light-emission element and the display each incorporating this light-emission element assembly, and the reinforcement section are examples. Moreover, the members, the materials, and the like thereof are also examples. These examples are modifiable as appropriate. If the reinforcement section is made hollow, and a follow part of the reinforcement section is filled with a mold material at the time of forming the mold section, mechanical strength of the pad section is allowed to be further improved. The formation of the metal layer is not limited to the plating method, and the metal layer may be formed based on other method such as a combination of a lift-off method, physical vapor deposition (PVD), or CVD with an etching technique. Moreover, it goes without saying that the light-emission element assembly, the method of manufacturing the same, and the display according to the embodiment (1) of the present disclosure may be combined with the light-emission element assembly, the method of manufacturing the same, and the display according to the embodiment (2) of the present disclosure.

In addition to the first light-emission element assembly, the second light-emission element assembly, and the third light-emission element assembly, a fourth light-emission element assembly, a fifth light-emission element assembly, and so on each may be added as the light-emission element assembly of the light-emission unit. It is to be noted that a sub-pixel is configured using each of these light-emission element assemblies, and one pixel is configured using the light-emission unit. Examples of such a case may include a light-emission unit to which a sub-pixel that emits white light is added to improve luminance, a light-emission unit to which a sub-pixel that emits complementary-color light is added to extend a color reproduction range, a light-emission unit to which a sub-pixel that emits yellow light is added to extend a color reproduction range, and a light-emission unit to which sub-pixels emitting yellow light and cyan light, respectively, are added to extend a color reproduction range. An image display (the light-emission element and the display) may not only be a flat-type color display and a direct-view-type color display represented by television receivers and computer terminals, but may be an image display of a type that projects an image on retinas of a person, and a projection-type image display. It is to be noted that any of these image displays may adopt a system such as, but not limited to, a field-sequential drive system. In this system, an image is displayed by performing time-divisional control of each light emission/non-emission state of each of the first light-emission element assembly, the second light-emission element assembly, and the third light-emission element assembly.

It is possible to achieve at least the following configurations from the above-described example embodiments of the disclosure.

(A01) A light-emission element assembly including:

a light-emission element;

a mold section in which the light-emission element is molded;

a pad section protruding from an undersurface of the mold section, and electrically connected to the light-emission element; and a reinforcement section provided in the pad section, and projecting towards a side on which the mold section is provided.

(A02) The light-emission element assembly according to (A01), wherein the reinforcement section is configured by a metal layer.

(A03) The light-emission element assembly according to (A02), wherein the metal layer is provided to extend on the pad section.

(A04) The light-emission element assembly according to any one of (A01) to (A03), wherein the reinforcement section projects towards the mold section.

(A05) The light-emission element assembly according to any one of (A01) to (A04), wherein the pad section protrudes at least from four corners of the undersurface of the mold section.

(B01) A light-emission element assembly including:

a light-emission element;

a mold section in which the light-emission element is molded;

a pad section protruding from an undersurface of the mold section, and electrically connected to the light-emission element; and a reinforcement section configured of a mold-section extended section extended from the mold section, and provided on the pad section.

(B02) The light-emission element assembly according to (B01), wherein the pad section protrudes at least from four corners of the undersurface of the mold section.

(C01) A display including a plurality of light-emission element assemblies arranged in a two-dimensional matrix, one or more of the plurality of light-emission element assemblies each including a light-emission element, a mold section in which the light-emission element is molded, a pad section protruding from an undersurface of the mold section, and electrically connected to the light-emission element, and a reinforcement section provided in the pad section, and projecting towards a side on which the mold section is provided.

(D01) A display including a plurality of light-emission element assemblies arranged in a two-dimensional matrix, one or more of the plurality of light-emission element assemblies each including a light-emission element, a mold section in which the light-emission element is molded, a pad section protruding from an undersurface of the mold section, and electrically connected to the light-emission element, and a reinforcement section configured of a mold-section extended section extended from the mold section, and provided on the pad section.

(E01) A method of manufacturing light-emission element assembly, the method including:

preparing a light-emission element assembly, the light-emission element assembly including a light-emission element, a mold section in which the light-emission element is molded, and a pad section protruding from an undersurface of the mold section, and electrically connected to the light-emission element; and forming a reinforcement section, by forming a projection section in the pad section and then forming a metal layer on the pad section and the projection section, the reinforcement section being provided in the pad section, and being configured by the metal layer projecting towards a side on which the mold section is provided.

(E02) The method of manufacturing the light-emission element assembly according to (E01), wherein the metal layer is formed by one of: formation of a primary layer and a plating method of the metal layer on the primary layer; a lift-off method; and a combination of any of physical vapor deposition and chemical vapor deposition with an etching technique.

(E03) The method of manufacturing the light-emission element assembly according to (E01) or (E02), wherein the metal layer is provided to extend on the pad section.

(E04) The method of manufacturing the light-emission element assembly according to any one of (E01) to (E03), wherein the reinforcement section projects towards the mold section.

(E05) The method of manufacturing the light-emission element assembly according to any one of (E01) to (E04), wherein the pad section protrudes at least from four corners of the undersurface of the mold section.

(F01) A method of manufacturing a light-emission element assembly, the method including:

preparing a light-emission element assembly, the light-emission element assembly including a light-emission element, a mold section in which the light-emission element is molded, and a pad section protruding from an undersurface of the mold section, and electrically connected to the light-emission element; and forming, on the pad section, a reinforcement section configured of a mold-section extended section extended from the mold section.

(F02) The method of manufacturing the light-emission element assembly according to (F01), wherein the pad section protrudes at least from four corners of the undersurface of the mold section.

It should be understood by those skilled in the art that various modifications, combinations, sub-combinations, and alterations may occur depending on design requirements and other factors insofar as they are within the scope of the appended claims or the equivalents thereof.

What is claimed is:

1. A light-emission element assembly comprising:
   a light-emission element;
   a mold section in which the light-emission element is molded;
   a pad section protruding from an undersurface of the mold section, and electrically connected to the light-emission element; and
   a reinforcement section provided in the pad section, and projecting towards a side on which the mold section is provided,
   wherein the reinforcement section protrudes from the pad section to the mold section.

2. The light-emission element assembly according to claim 1, wherein the reinforcement section is configured by a metal layer.

3. The light-emission element assembly according to claim 2, wherein the metal layer is provided to extend on the pad section.

4. The light-emission element assembly according to claim 1, wherein the reinforcement section projects towards the mold section.

5. The light-emission element assembly according to claim 1, wherein the pad section protrudes at least from four corners of the undersurface of the mold section.

6. A light-emission element assembly comprising:
   a light-emission element;
   a mold section in which the light-emission element is molded;
   a pad section protruding from an undersurface of the mold section, and electrically connected to the light-emission element; and
   a reinforcement section configured of a mold-section extended section extended from the mold section, and provided on the pad section,
   wherein the reinforcement section protrudes from the pad section to old section.

7. A display comprising
   a plurality of light-emission element assemblies arranged in a two-dimensional matrix, one or more of the plurality of light-emission element assemblies each including
   a light-emission element, a mold section in which the light-emission element is molded, a pad section protruding from an undersurface of the mold section, and electrically connected to the light-emission element, and a reinforcement section provided in the pad section, and projecting towards a side on which the mold section is provided, wherein the reinforcement section protrudes from the pad section to the mold section.

8. A display comprising a plurality of light-emission element assemblies arranged in a two-dimensional matrix, one or more of the plurality of light-emission element assemblies each including a light-emission element, a mold section in which the light-emission element is molded, a pad section protruding from an undersurface of the mold section, and electrically connected to the light-emission element, and a reinforcement section configured of a mold-section extended section extended from the mold section, and provided on the pad section, wherein the reinforcement section protrudes from the pad section to the mold section.

9. A method of manufacturing a light-emission element assembly, the method comprising:

preparing a light-emission element assembly, the light-emission element assembly including a light-emission element, a mold section in which the light-emission element is molded, and a pad section protruding from an undersurface of the mold section, and electrically connected to the light-emission element; and forming a reinforcement section, by forming a projection section in the pad section and then forming a metal layer on the pad section and the projection section, the reinforcement section being provided in the pad section, and being configured by the metal layer projecting towards a side on which the mold section is provided, wherein the reinforcement section protrudes from the pad section to the mold section.

10. The method of manufacturing the light-emission element assembly according to claim 9, wherein the metal layer is formed by one of:

formation of a primary layer and a plating method of the metal layer on the primary layer;

a lift-off method; and a combination of any of physical vapor deposition and chemical vapor deposition with an etching technique.

11. The method of manufacturing the light-emission element assembly according to claim 9, wherein the metal layer is provided to extend on the pad section.

12. The method of manufacturing the light-emission element assembly according to claim 9, wherein the reinforcement section projects towards the mold section.

13. The method of manufacturing the light-emission element assembly according to claim 9, wherein the pad section protrudes at least from four corners of the undersurface of the mold section.

14. A method of manufacturing a light-emission element assembly, the method comprising:

preparing a light-emission element assembly, the light-emission element assembly including a light-emission element, a mold section in which the light-emission element is molded, and a pad section protruding from an undersurface of the mold section, and electrically connected to the light-emission element; and forming, on the pad section, a reinforcement section configured of a mold-section extended section extended from the mold section, wherein the reinforcement section protrudes from the pad section to the mold section.

* * * * *